United States Patent
Inai et al.

(10) Patent No.: US 6,727,126 B2
(45) Date of Patent: Apr. 27, 2004

(54) MASKING MEMBER FOR FORMING FINE ELECTRODE AND MANUFACTURING METHOD THEREFOR, METHOD FOR FORMING ELECTRODE, AND FIELD EFFECT TRANSISTOR

(75) Inventors: Makoto Inai, Otsu (JP); Eiji Tai, Yasu-gun (JP); Hidehiko Sasaki, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/335,325

(22) Filed: Dec. 30, 2002

(65) Prior Publication Data
US 2003/0129818 A1 Jul. 10, 2003

(30) Foreign Application Priority Data

Jan. 10, 2002 (JP) .......................... 2002-003140
Nov. 25, 2002 (JP) .......................... 2002-340378

(51) Int. Cl.⁷ .......................................... H01L 21/338
(52) U.S. Cl. ........................................ 438/184; 438/717
(58) Field of Search .................. 216/59, 84; 430/5, 430/270.1, 312, 313, 322, 328, 394; 438/182, 183, 184, 652, 704, 717, 725

(56) References Cited

U.S. PATENT DOCUMENTS 4,975,382 A * 12/1990 Takasugi ................ 438/183
6,180,528 B1 * 1/2001 Sasaki et al. ............. 438/704
2003/0162406 A1 * 8/2003 Gehoski et al. ........... 438/725

FOREIGN PATENT DOCUMENTS

JP          6-53251       2/1994
JP          6-260509      9/1994
JP          2000 22131    1/2000

* cited by examiner

Primary Examiner—Evan Pert
Assistant Examiner—Asok Kumar Sarkar
(74) Attorney, Agent, or Firm—Ostrolenk, Faber, Gerb & Soffen, LLP

(57) ABSTRACT

A fine electrode-forming masking member for forming fine gate electrodes, which can decrease gate length of a gate electrode of a field effect transistor. The method includes forming a first masking member having penetrating portions formed into opening patterns in conformity with the fine gate electrodes, on a semiconductor substrate using a photosensitive resin; and heating the first masking member so that parts of sidewalk in contact with the substrate of the penetrating portions flow along the semiconductor substrate to form extension portions. Accordingly, the widths of the penetrating portions at the bottom surface side are decreased so as to form the opening patterns. Gate electrodes are formed on regions of the semiconductor substrate exposed through the opening patterns while the substrate is masked with the fine electrode-forming masking member.

12 Claims, 5 Drawing Sheets

(1)

(2)

(1)

(2)

(3)

(4)

(5)

(6)

(7)

(8)

(9)

MASKING MEMBER FOR FORMING FINE ELECTRODE AND MANUFACTURING METHOD THEREFOR, METHOD FOR FORMING ELECTRODE, AND FIELD EFFECT TRANSISTOR

BACKGROUND OF THE INVENTION

1. Field of the Invention

The present invention relates to masking members for forming fine electrodes and manufacturing methods therefor, methods for forming electrodes, and field effect transistors, and more particularly, relates to a technique capable of forming finer electrodes usable, for example, as gate electrodes of field effect transistors.

The present invention is advantageously applied to the fields of field effect transistors having hetero structures, which are operated in microwave or milliwave bands, and integrated circuit devices formed by integration thereof with other components.

2. Description of the Related Art

In recent years, concomitant with the advancement of information technology (IT), higher capacity and higher speed communication systems have been increasingly requested, and improvements in transmission speed of communications have been further desired. In addition, in radio communications, radar and fixed communication systems used in milliwave bands have been increasingly demanded.

Under these industrial circumstances, for example, a compound semiconductor field effect transistor (FET) having a higher operation speed has been desired in recent years. In general, in order to improve the operation speed of an FET, in addition to increasing the electron speed in an active layer material, it can be highly effective to decrease the gate length of an FET.

In the past, gate lengths of approximately 500 nm and approximately 200 to 100 nm have frequently been used in a microwave band (up to several GHz) and a quasi-milliwave band (up to 30 GHz). However, in recent years, because of advancements in exposure methods and in fine processing techniques for resist material, by using an electron beam exposure method, for example, a gate length of 100 nm or less (a sub-hundred nanometer range of approximately 20 to 50 nm) has been realized. Actually, an FET using an extremely short gate has been experimentally formed, and high-speed properties and high-gain properties thereof have been confirmed in a milliwave band.

A gate electrode having the sub-hundred nanometer range described above is generally formed by a lithographic technique using an electron beam exposure method as described above, and in order to obtain a fine opening width using an opening pattern capable of forming a shape in conformity with a gate electrode to be formed, a resist material having a high electron beam sensitivity is used, and in order to form a gate electrode having a cross-sectional T-shape, a multi-layer resist structure is used. The gate electrode is generally formed by deposition/lift-off, sputtering, or the like.

In the electron beam exposure method described above, since electron beams serve as the exposure source, and since the diameter of a convergent spot can be decreased by this method, it has been believed that the electron beam exposure method is most suitable for forming an extremely fine opening pattern having a length in the sub-hundred nanometer range.

However, according to this electron beam exposure method, since electron beams are converged and are then radiated, direct drawing must be performed at a position at which an opening portion is desired to be formed. That is, several thousand to several tens of thousands of areas at which gate electrodes of FETs are to be formed are present on one wafer, and all the areas mentioned above must be sequentially irradiated with electron beams to draw the patterns. In addition, if two or more gate electrodes are to be formed in one FET, it is easily estimated that an extremely long period of time is necessary to complete the exposure on one wafer.

On the other hand, according to a light exposure method, since exposure can be simultaneously performed in more than one chip area formed on a wafer, in contrast to the electron beam exposure method, exposure can be performed in an extremely short period of time.

However, in the light exposure method, since a light source having a wavelength of several hundred nanometers is used as an exposure source, the dimensions of an opening pattern to be formed are liable to be influenced by this wavelength, and hence it has been believed that the formation of a very fine pattern cannot be advantageously performed by a light exposure method.

Under the circumstances described above, attempts have been made to use a light exposure method for forming very fine patterns. According to a light exposure method using a conventional type of photomask (reticle), the limitation of fine pattern formation is approximately 300 nm; however, when an excimer laser (ArF or KrF) which is a short wavelength light source, a phase shift mask, a dummy gate process, or the like is used, the formation of a fine opening pattern having a length in the 100 to 200 nm range can be achieved even when a light exposure method is used.

In addition, according to patent publication 1, a method for decreasing an opening width of an opening pattern has been disclosed. The method comprises the steps of forming an opening pattern in a photoresist film formed on a semiconductor substrate by a photolithographic technique, and then performing heat treatment of the photoresist film at a temperature higher than a conventional post-baking temperature so that sidewall portions of the opening pattern formed in the photoresist film are distorted by being heated sufficiently to flow.

Furthermore, according to patent publication 2, a method has been disclosed in which a wall angle of a patterned resist film is controlled to be inclined by performing heat treatment of the patterned resist film. The purpose of this method is that when a gate electrode is formed by deposition, the opening formed in the resist film is not blocked by a gate metal material.

Patent publications 1 and 2 described above are Japanese Unexamined Patent Application Publication Nos. 6-104285 and 6-53251, respectively.

However, in the light exposure method, even when the technique described above capable of forming a finer pattern is used, opening dimensions having the sub-hundred nanometer range have still not been obtained as is the case in the past.

In particular, according to the technique disclosed in patent publication 1, since the side wall portions of the opening pattern are approximately uniformly distorted by heat, the thickness of an upstanding portion of the gate electrode is decreased, whereby disconnection of the gate electrode is liable to occur in the height direction, and in addition, the gate resistance may also be increased in some cases.

In addition, according to the technique disclosed in patent publication 2, since the wall angle of the resist film is controlled to be inclined, the opening width of the opening pattern formed in the resist film may be undesirably increased in some cases, and as a result, the object of forming finer electrodes cannot be obtained.

SUMMARY OF THE INVENTION

Accordingly, the present invention was made to solve the problems described above, and is able to provide a masking member (hereinafter referred to as "fine electrode-forming masking member") for forming fine electrodes and a manufacturing method therefor, a method for forming electrodes, and a field effect transistor.

According to the present invention, although a light exposure method is used, a fine electrode-forming masking member having an opening width of 100 nm or less can be obtained, and when this fine electrode-forming masking member is used, a finer electrode, such as a gate electrode used for a field effect transistor or the like, can be formed without substantial increase in disconnection or resistance.

First, the present invention is used for forming fine electrodes on a substrate and relates to a method for manufacturing a fine electrode-forming masking member having opening patterns in conformity with the shape of the fine electrodes.

In order to solve the technical problems described above, the method of the present invention comprises a step of forming a first masking member having penetrating portions to be formed into the opening patterns on the substrate using a photosensitive resin; and a step of heat treating the first masking member so that parts of sidewalls, which are in contact with the substrate, of the penetrating portions formed in the first masking member, are extended along the substrate by the heat treatment to form extension portions. As a result, the widths of the penetrating portions at the bottom surface side are decreased so as to form the opening patterns.

The step of forming the first masking member described above may comprise a step of forming dummy patterns in conformity with the shape of the penetrating portions on the substrate; a step of forming a second masking member on the substrate except for regions covered with the dummy patterns; and a step of removing the dummy patterns for forming the penetrating portions.

The second masking member described above preferably comprises a negative type photosensitive resin, and the dummy pattern preferably comprises a positive type photosensitive resin.

In addition, after the step of forming the second masking member, a step of performing heat treatment of the negative type photosensitive resin and the positive type photosensitive resin is preferably performed so that mixed layers each composed of both the negative type photosensitive resin and the positive type photosensitive resin are formed along the boundaries between the second masking member and the dummy patterns.

In the method for manufacturing the fine electrode-forming masking member, according to the present invention, each of the penetrating portions formed in the forming step preferably has a width of 0.1 to 0.2 μm between sidewalls opposing each other.

In the heating step for decreasing the widths of the penetrating portions at the bottom surface side, each of the extension portions preferably has an extension width of 0.01 to 0.05 μm along the substrate.

In addition, each of the opening patterns obtained in the heating step preferably has a width of 0.1 μm or less at the bottom surface side.

The heating step for decreasing the widths of the penetrating portions at the bottom surface side is preferably performed at a temperature of 160 to 200° C.

The present invention may also be applied to the fine electrode-forming masking members manufactured by the methods described above. In this fine electrode-forming masking member, the opening patterns each have a small width at the bottom surface side as compared to that at the open end side.

The present invention is also applied to a method for forming fine electrodes using the fine electrode-forming masking member described above. The method for forming the fine electrodes of the present invention comprises a first step of preparing one of the fine electrode-forming masking members described above; a second step of forming fine electrodes on regions of the substrate exposed through the opening patterns while the substrate is masked with the fine electrode-forming masking member; and a third step of removing the fine electrode-forming masking member.

Before the second step is performed, a step of performing recess etching may be further performed on the regions of the substrate exposed through the opening patterns while the substrate is masked with the fine electrode-forming masking member.

The method for forming the fine electrodes described above is preferably applied to the formation of gate electrodes for field effect transistors. In this case, the substrate may be a semiconductor substrate, and the fine electrode may be a gate electrode used in a field, effect transistor.

Furthermore, the present invention is applied to a field effect transistor using the gate electrode formed by the method for forming the fine electrodes described above.

Other features and advantages of the present invention will become apparent from the following description of embodiments of the invention which refers to the accompanying drawings.

DESCRIPTION OF EMBODIMENTS OF THE INVENTION

FIGS. 1A to 1H are views showing a method for forming a gate electrode of a field effect transistor, according to an embodiment of the present invention.

Figure 1:
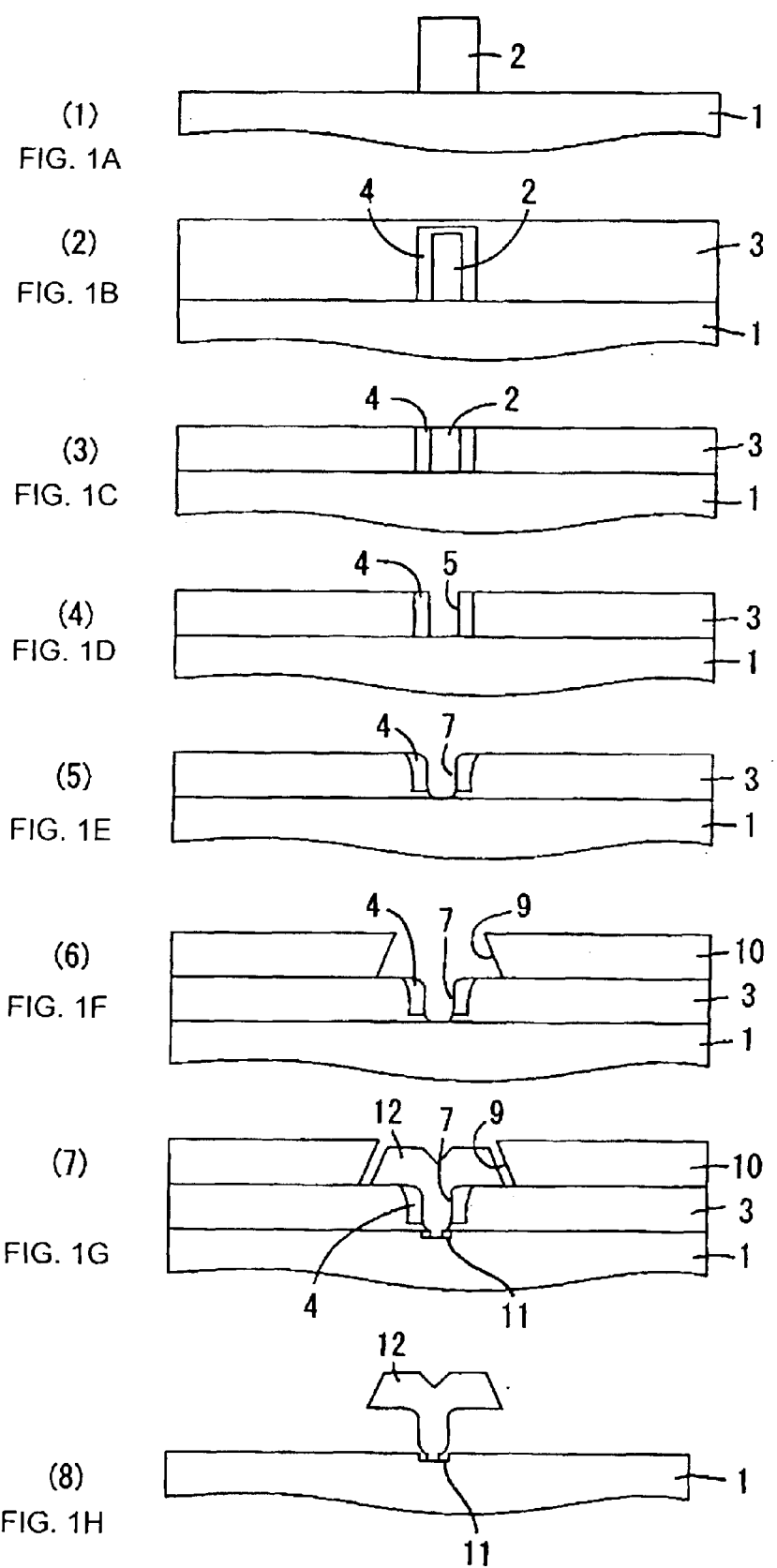
FIGS. 1A to 1H are cross-sectional views sequentially showing typical steps included in a method for forming a gate electrode of a field effect transistor, according to one embodiment of the present invention.

First, as shown in FIG. 1A, a semiconductor substrate 1 is prepared. On this semiconductor substrate 1, although not shown in the figure, a source and a drain region, a gate region, and the like are formed by a general semiconductor manufacturing process. The semiconductor substrate 1 is, for example, a GaAs or an InP substrate, and an active layer used as the gate region is formed by an ion implantation method or an epitaxial method such as molecular beam epitaxy (MBE) or metal oxide chemical vapor deposition (MOCVD). This epitaxial layer preferably has a hetero junction structure composed of a plurality of mixed crystal materials selected from the group consisting of GaAs, AlGaAs, InGaAs, InAlAs, InGaP, and the like.

Next, as also shown in FIG. 1A, a dummy pattern 2 is formed on the gate region of the semiconductor substrate 1 by a light exposure method. The dummy pattern 2 is composed, for example, of a positive photosensitive resin, which is a positive type resist. The dummy pattern 2 is called a dummy gate when a gate electrode is formed as in this embodiment, the dummy gate length is set to 200 nm or less, and the thickness thereof is, for example, from 0.5 to 1.5 μm (500–1500 nm). Since the dummy pattern 2 remains after a light exposure method is used for the positive type resist, the dummy pattern 2 is not exposed in this stage.

Next, as shown in FIG. 1B, a negative type photosensitive resin, that is, a negative type resist, is applied to the semiconductor substrate 1, and heat treatment is then used. As a result, a masking member 3 is formed on the semiconductor substrate 1 except for the region covered with the dummy pattern 2. In this step, since the dummy pattern 2 and the masking member 3 are brought into contact with each other and are processed by the heat treatment as described above, a mixed layer 4, which composed of the negative type resist and the positive type resist, is formed along the boundary between the masking member 3 and the dummy pattern 2.

As shown in FIG. 1C, the surface portion of the masking member 3 and part of the mixed layer 4 are removed, and hence the dummy pattern 2 and the mixed layer 4 are exposed on the surface of the masking member 3. For this removal, for example, a reactive ion etching apparatus is used.

Next, as shown in FIG. 1D, the dummy pattern 2 is selectively removed, and hence a penetrating portion 5, which becomes an opening pattern, is formed in the masking member 3. The width between opposing sidewalls of the penetrating portion 5 is set, for example, from 100 to 200 nm.

In the step of removing the dummy pattern 2 described above, first, the dummy pattern 2, the mixed layer 4, and the masking member 3 are all exposed without using a mask. As a result, only the dummy pattern 2 is ready to be removed by development. Next, the development is then performed. In this development, the dummy pattern 2 is dissolved in a developer and is removed; however, since the mixed layer 4 is insoluble in the developer, as is the masking member 3, the mixed layer 4 is not removed. As a result, the mixed layer 4 is formed on the sidewall of the penetrating portion 5. In this state, the mixed layer 4 becomes to constitute part of the masking member 3.

Figure 2:
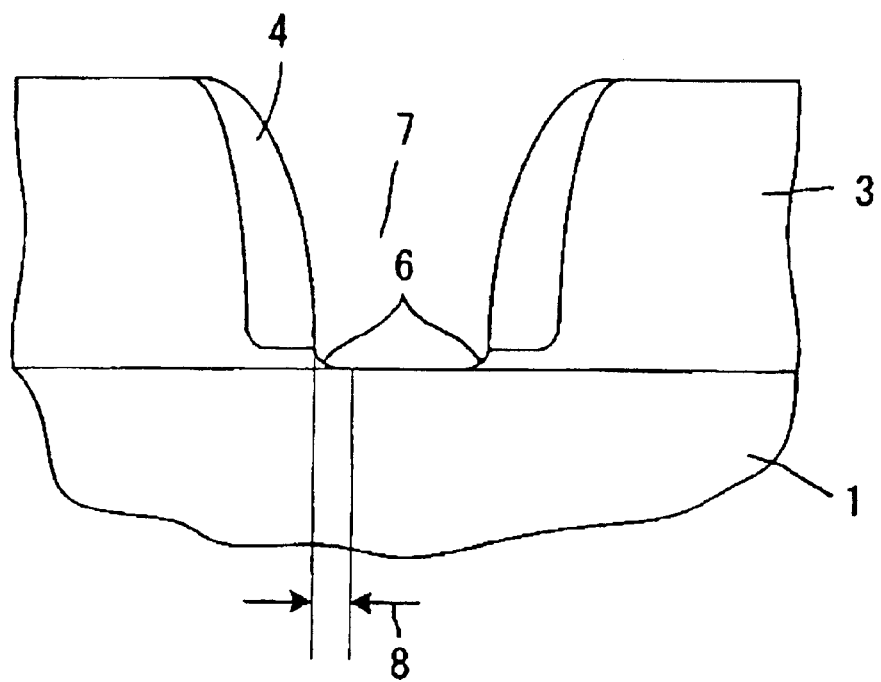
FIG. 2 is a partly enlarged cross-sectional view of the structure shown in FIG. 1E.

Next, the masking member 3 is processed by heat treatment. As a result, the state shown in FIG. 1E can be obtained. FIG. 2 is a partly enlarged view of the structure shown in FIG. 1E.

As clearly shown in FIG. 2, by the heat treatment described above, the masking member 3 is heat-distorted. As a result, the masking member 3 flows, and a part of the sidewall of the penetrating portion 5 (see FIG. 1D), which is in contact with the semiconductor substrate 1, flows along the semiconductor substrate 1. An extension portion 6 created by this flow has an extension width 8, as shown in FIG. 2.

Figure 3A:
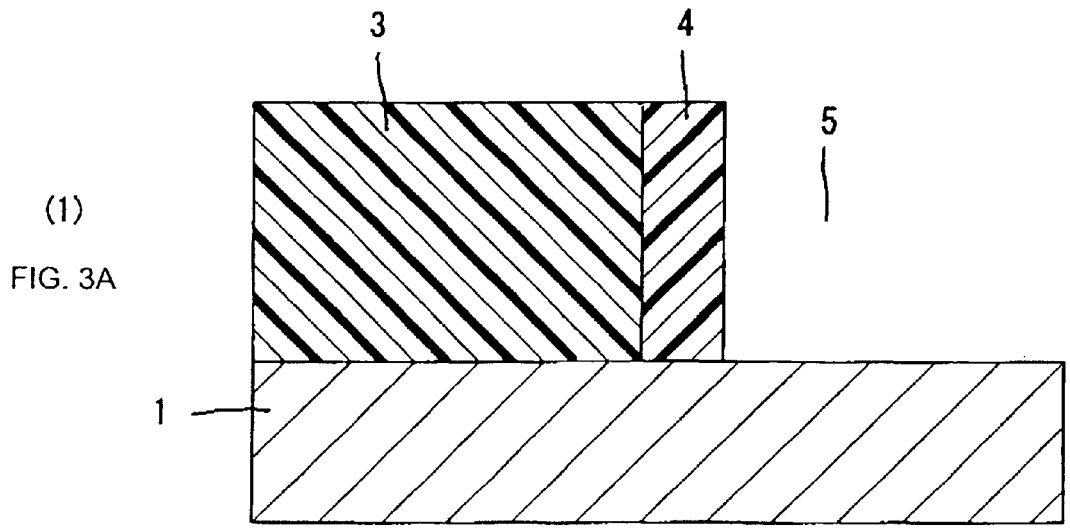
FIGS. 3A and 3B are schematic enlarged cross-sectional views showing the formation of a masking member and a mixed layer on a semiconductor substrate for illustrating the mechanism in which an extension portion shown in FIG. 2 is formed, FIG. 3A showing the state before heat treatment corresponding to that shown in FIG. 1D, and FIG. 3B showing the state after the heat treatment corresponding to that shown in FIG. 1E.
Figure 3B:
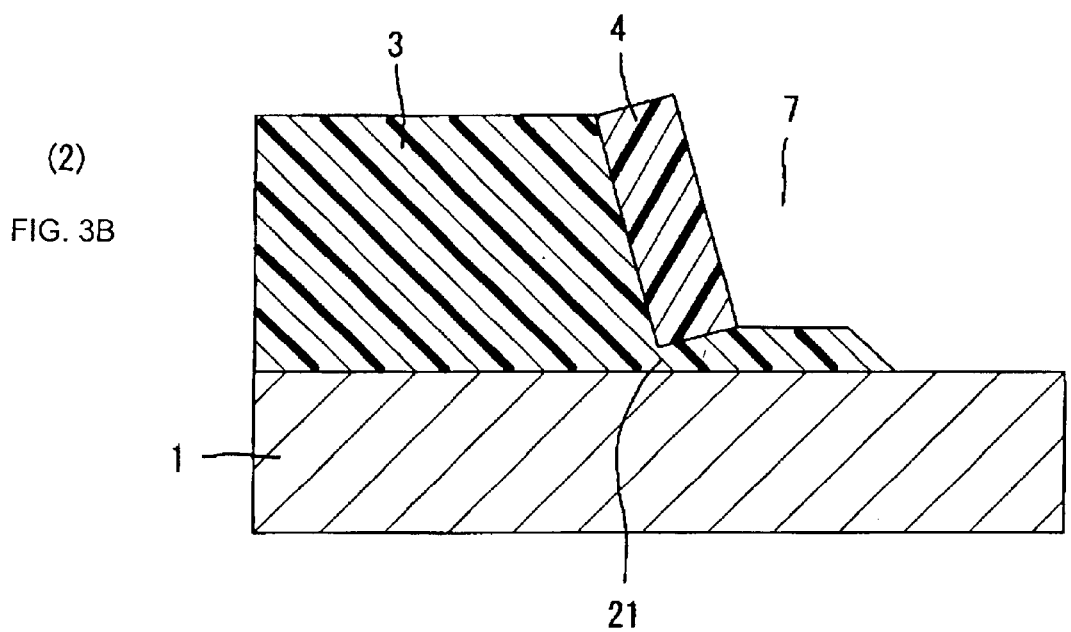

The formation of the extension portion 6 is achieved by the mechanism shown in FIGS. 3A and 3B. FIGS. 3A and 3B are each a schematic enlarged cross-sectional view showing the state in which the masking member 3 and the mixed layer 4 are formed on the semiconductor substrate 1. FIG. 3A shows the state before the heat treatment. And FIG. 3B shows the state after the heat treatment. Accordingly, FIG. 3A corresponds to FIG. 1D, and FIG. 3B corresponds to FIG. 1E and FIG. 2.

Compared to the masking member 3 composed of the negative type resist, even when heat treatment is used, the mixed layer 4 is not easily distorted, that is, is unlikely to flow. Accordingly, as shown in FIG. 3B, even when the masking member 3, which is composed of the negative type resist, is substantially distorted, the mixed layer 4 is distorted less, or not at all. As a result, the bottom end of the mixed layer 4 is slightly lifted from the semiconductor substrate 1, thereby forming a gap 21 between the mixed layer 4 and the semiconductor substrate 1.

Accordingly, before the heat treatment, the masking member 3 is clearly defined by the mixed layer 4 as shown in FIG. 3A; however, when heated, the masking member 3 becomes likely to flow and, as a result, flows outside the mixed layer 4 through the gap 21 between the mixed layer 4 and the semiconductor substrate 1 as shown in FIG. 3B. Subsequently, this portion of the masking member 3 that flows out forms the extension portion 6 described above.

As described above with reference to FIG. 2, the width of the penetrating portion 5 at the bottom surface side is thereby decreased, and as a result, an opening pattern 7, which has a shape corresponding to the desired shape of the gate electrode, is formed in the masking member 3. The width of the opening pattern 7 at the open end side is substantially equivalent to that of the penetrating portion 5 at the open end side before heat treatment regardless of whether the extension portion 6 is formed.

Conditions of heat treatment of the semiconductor substrate 1 for forming the extension portion 6 are determined by a heating temperature and time. The heating temperature is preferably set between about 160 degrees Celsius and about 200 degrees Celsius, and the time is 10 seconds or more.

The heat treatment may be performed for example for 10 seconds to 30 minutes by disposing a hot plate heated between 130 degrees Celsius and 180 degrees Celsius. under the side of the semiconductor substrate 1. The heat treatment may also be performed in an oven at a temperature set between about 150 degrees Celsius and 200 degrees Celsius for 10 to 60 minutes.

When the hot plate is used, the temperature is first increased at the side of the semiconductor substrate 1, and the temperature at the upper part of the masking member 3 is increased later. Accordingly, before the open end side of the opening pattern 7 formed in the masking member 3 is distorted by the increase in temperature, a temperature at part of the masking member 3, which is in contact with the semiconductor substrate 1, is increased, and hence the formation of the extension portion 6 described above is further facilitated by the distortion caused by this increase in temperature.

The extension width 8 of the extension portion 6 varies in accordance with the conditions of the heat treatment described above. Accordingly, by controlling the conditions described above, it is possible to set the extension width 8 at from 10 to 50 nm, preferably, and also to set the width of the opening pattern 7 at the bottom surface side preferably at 100 nm or less.

When the extension width 8 is formed to be 20 nm under particular conditions, and the width between the opposing sidewalls of the penetrating portion 5 is set to 100 nm before the heat treatment, the width of the opening pattern 7 at the bottom surface side becomes 60 nm. Since the extension width 8 is substantially proportional to a temperature and a time condition of the heat treatment, it is relatively easy to select heat treatment conditions for forming the opening pattern 7 having a desired width at the bottom surface side.

Next, as shown in FIG. 1F, for example, an upper masking member 10 having an opening pattern 9 is formed on the masking member 3 by performing exposure and development of a positive photosensitive resin provided on the masking member 3. The opening pattern 9 is larger than that of the opening pattern 7. As a result, the two opening patterns 7 and 9 form a cross-sectional T-shape.

Next, as shown in FIG. 1G, recess etching is performed on a region of the semiconductor substrate 1 exposed through the opening pattern 7 so as to form a recess 11.

Subsequently, the masking members 3 and 10 are used as masks to form a gate electrode 12 on a region of the semiconductor substrate 1 exposed through the opening patterns 7 and 9. The gate electrode 12 comprises a bottom layer composed of platinum (Pt), titanium (Ti), tungsten silicide (WSi), or the like, and is formed by deposition or sputtering. In conformity with the shape formed by the opening patterns 7 and 9, the gate electrode 12 has a cross-sectional T-shape.

Next, the masking members 3 and 10 are removed by a solvent or by ashing, and as a result, as shown in FIG. 1H, the gate electrode 12 remains alone on the semiconductor substrate 1.

After the formation of the gate electrode 12 described above, a protective film, lead electrode pads, wires, and the like are formed, thereby forming a field effect transistor.

As can be easily estimated from the shape of the masking member 3 having the extension portion 6 as shown in FIG. 2, without decreasing the thickness of an upstanding portion of the gate electrode 12 thus formed, the gate length can be decreased. As a result, disconnection in the height direction of the gate electrode 12 is unlikely to occur, an increase in gate resistance is also unlikely to occur, and furthermore, the operation speed of the field effect transistor can be improved by decreasing the gate length.

Figure 4:
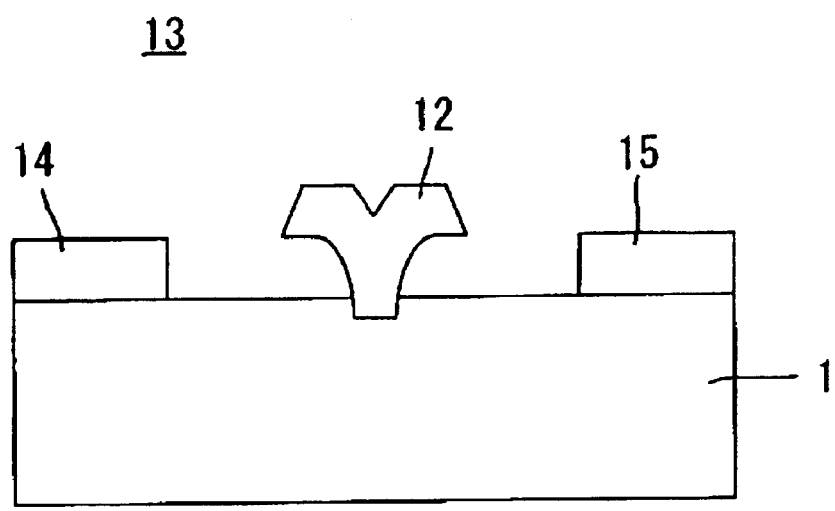
FIG. 4 is a schematic cross-sectional view showing the structure of a field effect transistor.

FIG. 4 is a schematic view showing a field effect transistor 13 formed as described above.

In the field effect transistor 13, on the semiconductor substrate 1, in addition to the gate electrode 12, a source electrode 14 and a drain electrode 15 are also formed. The source electrode 14 and the drain electrode 15 are generally formed on the semiconductor substrate 1 before the steps shown in FIGS. 1A to 1H are performed; however, they may also be formed after the gate electrode 12 is formed.

FIGS. 5A to 5I are views showing a method for manufacturing a field effect transistor, according to another embodiment of the present invention. In order to avoid duplication of descriptions, the reference numerals of the constituent elements shown in FIGS. 1A to 1H designate the equivalent constituent elements in FIGS. 5A to 5I.

The steps shown in FIGS. 5A to 5E are substantially equivalent to those shown in FIGS. 1A to 1E. Accordingly, the descriptions of the steps shown in FIGS. 5A to 5E are omitted, and the descriptions of the steps shown in FIG. 1A to 1E may be used therefor.

Figure 5A:
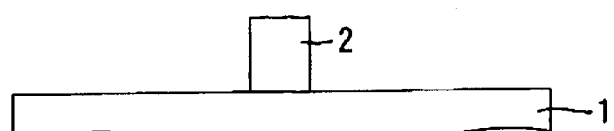
FIGS. 5A to 5I are cross-sectional views sequentially showing typical steps included in a method for forming a gate electrode of a field effect transistor, according to another embodiment of the present invention.
Figure 5B:
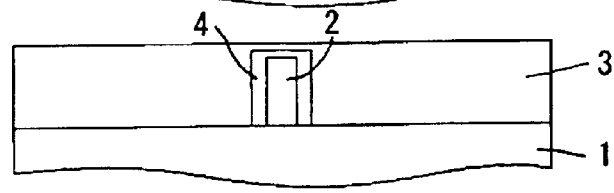
Figure 5C:
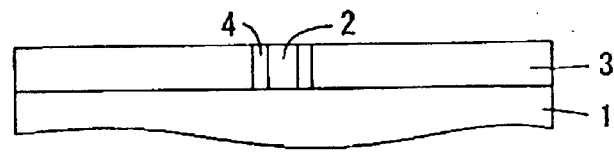
Figure 5D:
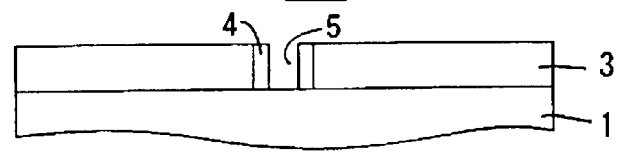
Figure 5E:
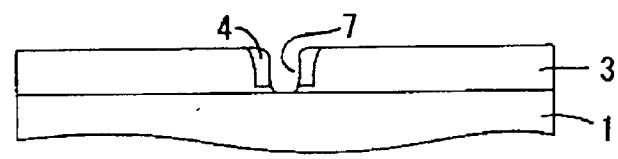
Figure 5F:
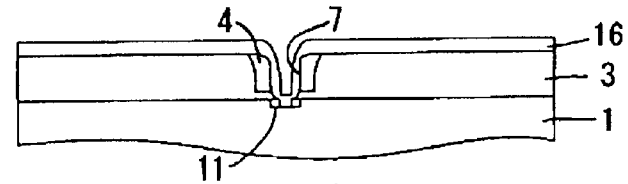

After the steps shown in FIG. 5E, as shown in FIG. 5F, recess etching is performed in a region of the semiconductor substrate 1 exposed through the opening pattern 7 for forming the recess 11.

Next, as also shown in FIG. 5F, a heat stable metal layer 16 composed of a heat stable metal such as WSi or tungsten silicide nitride (WSiN) is formed by sputtering or the like so as to cover continuously from the inside of the recess 11 to the upper surface of the masking member 3.

Figure 5G:
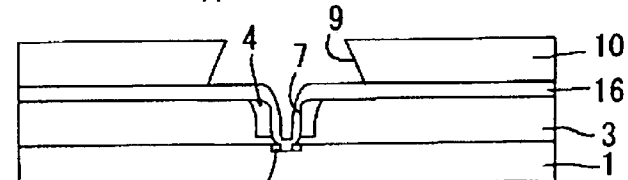

Next, as shown in FIG. 5G, on the heat stable metal layer 16, the upper masking member 10 having the opening pattern 9 is formed. The opening pattern 9 has an opening width larger than that of the opening pattern 7 formed in the masking member 3 on the semiconductor substrate 1.

Figure 5H:
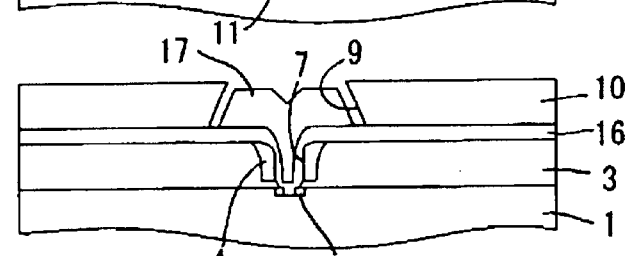

Next, as shown in FIG. 5H, in a region which is on the heat stable metal layer 16 and which is defined by the opening patterns 7 and 9, a low-resistance metal layer 17 is formed by deposition/lift-off, sputtering, or the like using a low-resistance metal such as Ti, Pt, or gold (Au).

Figure 5I:
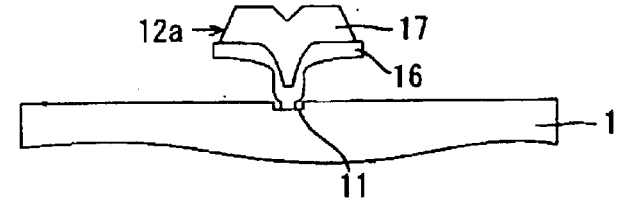

Next, the heat stable metal layer 16 in a region other than the gate region is removed by etching, and in addition, the masking members 3 and 10 are removed by a solvent or by ashing, as shown in FIG. 5I. Thus, a gate electrode 12a composed of the heat stable metal layer 16 and the low-resistance metal layer 17 remains alone on the semiconductor substrate 1.

In addition, the same steps as those described in the embodiment described with reference to FIGS. 1A to 1H are performed, thereby forming a field effect transistor.

The present invention is applied to the formation of the gate electrode of the field effect transistor in the embodiment described above; however, the present invention is not limited thereto and, in addition to the gate electrodes, may be applied to the formation of fine wires or fine electrodes such as fine contact holes used for other semiconductor devices or other electronic elements.

In addition, the present invention may be advantageously applied to various cases in addition to the case in which an opening pattern having a fine width, for example, of 0.1 $\mu$m or less is formed.

As described above, according to the present invention, to form a fine electrode-forming masking member for forming fine electrodes, a first masking member, which has penetrating portions to be formed into opening patterns in conformity with the fine electrode, is formed on a substrate using a photosensitive resin, and heat treatment is then performed so that parts of sidewalls, which are in contact with the substrate, of the penetrating portions formed in the first masking member, extend along the substrate to form extension portions. As a result, the widths of the penetrating portions at the bottom surface side are decreased to form the opening patterns. Accordingly, when the fine electrodes are formed on regions of the substrate exposed through the opening patterns while the substrate is masked with the fine electrode-forming masking member, the widths of the fine electrodes at positions in contact with the substrate can be significantly decreased.

Accordingly, when the gate electrode of a field effect transistor is formed using the fine electrode-forming masking member as described above, a gate length of 100 nm or less, which has been difficult to achieve by the light exposure method in the past, can be realized, and a field effect transistor having a high operation speed and high gain properties can be obtained.

In addition, according to the present invention, since the manufacturing of the fine electrode-forming masking member can be performed by a light exposure method, thereby forming the opening pattern, exposure can be simultaneously performed on more than one chip area in an extremely short period of time, and hence, a great number of electrodes, such as gate electrodes each having a gate length of 100 nm or less, can be formed at a reasonable cost.

Furthermore, when the opening width formed by well-known exposure method is larger, the yield thereof is increased. According to the present invention, since the opening width formed by well-known exposure method is relatively large, and the width of the penetrating portion at the bottom surface side is then decreased, a fine opening width can be realized with high yield.

Although the present invention has been described in relation to particular embodiments thereof, many other variations and modifications and other uses will become apparent to those skilled in the art. Therefore, the present invention is not limited by the specific disclosure herein.

What is claimed is:

1. A method for manufacturing a fine electrode-forming masking member for forming fine electrodes on a substrate, the fine electrode-forming masking member having opening patterns in conformity with the fine electrodes, comprising:
    a step of forming a first masking member having penetrating portions to be formed into the opening patterns on the substrate using a photosensitive resin; and
    a step of heat treating the first masking member so that parts of sidewalls, which are in contact with the substrate, of the penetrating portions formed in the first masking member, are extended along the substrate to form extension portions, whereby the widths of the penetrating portions at the substrate surface are decreased to form the opening patterns.

2. A method for manufacturing a fine electrode-forming masking member, according to claim 1, wherein the step of forming the first masking member comprises:
    a step of forming dummy patterns in conformity with the shape of the penetrating portions on the substrate;
    a step of forming a second masking member on the substrate except for regions covered with the dummy patterns; and
    a step of removing the dummy patterns for forming the penetrating portions.

3. A method for manufacturing a fine electrode-forming masking member, according to claim 2, wherein the second masking member is formed of a negative type photosensitive resin, and the dummy patterns are formed of a positive type photosensitive resin.

4. A method for manufacturing a fine electrode-forming masking member, according to claim 3, further comprising: after the step of forming the second masking member, a step of performing heat treatment of the negative type photosensitive resin and the positive type photosensitive resin so that mixed layers each composed of the negative type photosensitive resin and the positive type photosensitive resin are formed along the boundaries between the second masking member and the dummy patterns.

5. A method for manufacturing a fine electrode-forming masking member, according to one of claims 1 to 4, wherein the penetrating portions are formed in the forming step so as to have a width of 0.1 to 0.2 $\mu$m between sidewalls opposing each other.

6. A method for manufacturing a fine electrode-forming masking member, according to one of claims 1 to 4, wherein the extension portions are formed in the heating step so as to have an extension width of 0.01 to 0.05 $\mu$m along the substrate.

7. A method for manufacturing a fine electrode-forming masking member, according to one of claims 1 to 4, wherein the opening patterns are formed in the heating step so as to have a width of 0.1 $\mu$m or less at the substrate surface.

8. A method for manufacturing a fine electrode-forming masking member, according to one of claims 1 to 4, wherein the heating step is performed at a temperature of 160 to 200° C.

9. A method for forming fine electrodes comprising:
    a first step of preparing the fine electrode-forming masking member formed by the method according to one of claims 1 to 4;
    a second step of forming the fine electrodes on regions of the substrate exposed through the opening patterns while the substrate is masked with the fine electrode-forming masking member; and
    a third step of removing the fine electrode-forming masking member.

10. A method for forming fine electrodes according to claim 9, wherein the substrate is a semiconductor substrate, and the fine electrodes are gate electrodes of respective field effect transistors formed on said semiconductor substrate.

11. A method for forming fine electrodes according to claim 9, further comprising: before the second step, a step of performing recess etching on the regions of the substrate exposed through the opening patterns while the substrate is masked with the fine electrode-forming masking member.

12. A method for forming fine electrodes according to claim 11, wherein the substrate is a semiconductor substrate, and the fine electrodes are gate electrodes of respective field effect transistors formed on said semiconductor substrate.

* * * * *